US012683490B2

(12) United States Patent
Hong

(10) Patent No.: US 12,683,490 B2
(45) Date of Patent: Jul. 14, 2026

(54) SWITCHED-CAPACITOR CIRCUIT AND PIPELINED ANALOG-TO-DIGITAL CONVERTOR INCLUDING THE SAME

(71) Applicant: Realtek Semiconductor Corporation, Hsinchu (TW)

(72) Inventor: Wei-Cian Hong, Hsinchu (TW)

(73) Assignee: Realtek Semiconductor Corporation, Hsinchu (TW)

(*) Notice: Subject to any disclaimer, the term of this patent is extended or adjusted under 35 U.S.C. 154(b) by 93 days.

(21) Appl. No.: 18/755,689

(22) Filed: Jun. 27, 2024

(65) Prior Publication Data

US 2025/0007397 A1    Jan. 2, 2025

(30) Foreign Application Priority Data

Jun. 30, 2023    (TW) ................................. 112124537

(51) Int. Cl.
*H03M 1/12*        (2006.01)
*H02M 3/07*        (2006.01)

(52) U.S. Cl.
CPC ............. *H02M 3/07* (2013.01); *H03M 1/124* (2013.01)

(58) Field of Classification Search
CPC .... H03M 1/164; H03M 1/167; H03M 1/0607; H03M 1/12; H03M 1/1245; H03M 1/38; H03M 1/442; H03M 1/46; H03M 1/468; H03M 1/66; H03M 1/06; H03M 1/145; H03M 1/168; H03M 1/361; H03M 1/50; H03M 1/54; H03M 3/456; H03M 1/001; H03M 1/002; H03M 1/0604; H03M 1/0612; H03M 1/0656; H03M 1/0695;

H03M 1/0845; H03M 1/0854; H03M 1/1023; H03M 1/121; H03M 1/16; H03M 1/183; H03M 1/201; H03M 1/403; H03M 1/52; H03M 1/56; H03M 1/60; H03M 1/662; H03M 1/802; H03M 1/804; H03M 3/342; H03M 3/356; H03M 3/37; H03M 3/39; H03M 3/422; H03M 3/426; H03M 3/43; H03M 3/434; H03M 3/464; H03M 3/47

(Continued)

(56) References Cited

U.S. PATENT DOCUMENTS 9,219,490 B1 * 12/2015 Pereira .................. H03M 1/007
9,362,936 B1 *  6/2016 Caffee .................... H03K 5/135

(Continued)

*Primary Examiner* — Linh V Nguyen
(74) *Attorney, Agent, or Firm* — CKC & Partners Co., LLC

(57)                    ABSTRACT

A switched-capacitor circuit includes a sampling capacitor array, a charge-transfer circuit and a control circuit. The sampling capacitor array is configured to sample an input voltage in a sampling phase. The charge transfer circuit includes a first current source and a second current source having different current-voltage characteristics, in which the first current source and the second current source are coupled with an output terminal. The control circuit is configured to adjust, in a preset phase, a sampling result of the sampling capacitor array according to the input voltage in order to generate an adjusted voltage. The control circuit is further configured to enable one of the first current source and the second current source in a charge-transfer phase, according to the input voltage, so that the charge-transfer circuit amplifies the adjusted voltage in the charge-transfer phase to generate an output voltage at the output terminal.

17 Claims, 9 Drawing Sheets

(58) Field of Classification Search
 USPC ........ 341/155, 161, 162, 172, 144, 118, 120
 See application file for complete search history.

(56) References Cited

U.S. PATENT DOCUMENTS

| | | | | |
|---|---|---|---|---|
| 9,483,028 | B1* | 11/2016 | Kinyua ................. | H03M 1/124 |
| 9,595,974 | B1* | 3/2017 | Pereira ................. | H03M 1/164 |
| 9,673,835 | B1* | 6/2017 | Kinyua .............. | H03M 1/0607 |
| 2004/0046605 | A1 | 3/2004 | Granville | |
| 2010/0328119 | A1* | 12/2010 | Kobayashi .......... | H03M 1/0607 |
| | | | | 341/110 |
| 2011/0169340 | A1* | 7/2011 | Straayer ................. | H02M 3/07 |
| | | | | 307/109 |
| 2017/0070695 | A1* | 3/2017 | Shinozuka ............. | H04N 25/78 |
| 2019/0296756 | A1* | 9/2019 | Ali ...................... | H03F 3/45237 |
| 2022/0337258 | A1* | 10/2022 | Shen ................... | G11C 27/024 |
| 2023/0012330 | A1* | 1/2023 | Michel .................. | H03F 3/005 |

* cited by examiner

SWITCHED-CAPACITOR CIRCUIT AND PIPELINED ANALOG-TO-DIGITAL CONVERTOR INCLUDING THE SAME

RELATED APPLICATIONS

This application claims priority to Taiwan Application Serial Number 112124537, filed on Jun. 30, 2023, which is herein incorporated by reference in its entirety.

BACKGROUND

Technical Field

The present disclosure relates to a switched-capacitor circuit and a pipelined analog-to-digital converter (ADC) comprising the same. More particularly, the present disclosure relates to a switched-capacitor circuit and a pipelined ADC comprising the same capable of reducing errors in output currents.

Description of Related Art

The operation of a switched-capacitor circuit can be roughly divided into a sampling phase and a charge-transfer phase. In the sampling phase, the switched-capacitor circuit uses a capacitor to store a difference between an input voltage and a common voltage. Then, in the charge-transfer phase, the switched-capacitor circuit uses a charge pump to generate a corresponding output voltage at an output terminal according to a sampling result. Before the charge-transfer phase, a preset voltage is used to reset the output terminal, so as to erase the output voltage in the previous operation. When the output voltage is relatively low, the charge pump operates accordingly under a larger voltage difference. On the other hand, when the output voltage is relatively high, the voltage difference across the charge pump is relatively low. Due to the channel effect, the output current of the charge pump varies as the voltage difference changes, and thus reduces the accuracy of the switched-capacitor circuit.

SUMMARY

The present disclosure provides a switched-capacitor circuit, which includes a first sampling capacitor array, a charge-transfer circuit and a control circuit. The first sampling capacitor array is configured to sample a first input voltage in a sampling phase. The charge-transfer circuit comprises a first current source and a second current source with different current-voltage characteristics. The first current source and the second current source are coupled to a first output terminal. The control circuit is configured to adjust a sampling result of the first sampling capacitor array in a preset phase according to the first input voltage to generate a first adjusted voltage, and configured to enable one of the first current source and the second current source in a charge-transfer phase according to the first input voltage, so that the charge-transfer circuit amplifies the first adjusted voltage in the charge-transfer phase in order to generate a first output voltage at the first output terminal.

The present disclosure provides a switched-capacitor circuit, which includes a first sampling capacitor array, a charge-transfer circuit, and a control circuit. The first sampling capacitor array is configured to sample a first input voltage in a sampling phase. The charge-transfer circuit includes a first current source and a second current source with different current-voltage characteristics, where the first current source and the second current source are coupled to a first output terminal. The control circuit is configured to couple a first reference voltage to a sample result of the first sampling capacitor array in a preset phase to generate a first adjusted voltage, and is configured to determine, according to a relationship between a plurality of voltage thresholds and the first input voltage, magnitude of the first reference voltage and select one of the first current source and the second current source to be enabled in a charge-transfer phase, so that the charge-transfer circuit amplifies the first adjusted voltage in the charge-transfer phase in order to generate a first output voltage at the first output terminal.

The present disclosure provides a pipelined ADC, including a plurality of converter circuit systems, where each converter circuit system includes a first sampling capacitor array, a charge-transfer circuit, and a control circuit. The first sampling capacitor array is configured to sample a first input voltage in a sampling phase. The charge-transfer circuit includes a first current source and a second current source with different current-voltage characteristics, where the first current source and the second current source are coupled to a first output terminal. The control circuit is configured to adjust a sampling result of the first sampling capacitor array in a preset phase according to the first input voltage to generate a first adjusted voltage, and is configured to enable one of the first current source and the second current source in a charge-transfer phase according to the first input voltage, so that the charge-transfer circuit amplifies the first adjusted voltage in the charge-transfer phase in order to generate a first output voltage at the first output terminal.

One of advantages of the aforementioned switched-capacitor circuit and pipelined ADC is their high linearity.

DETAILED DESCRIPTION

Figure 1:
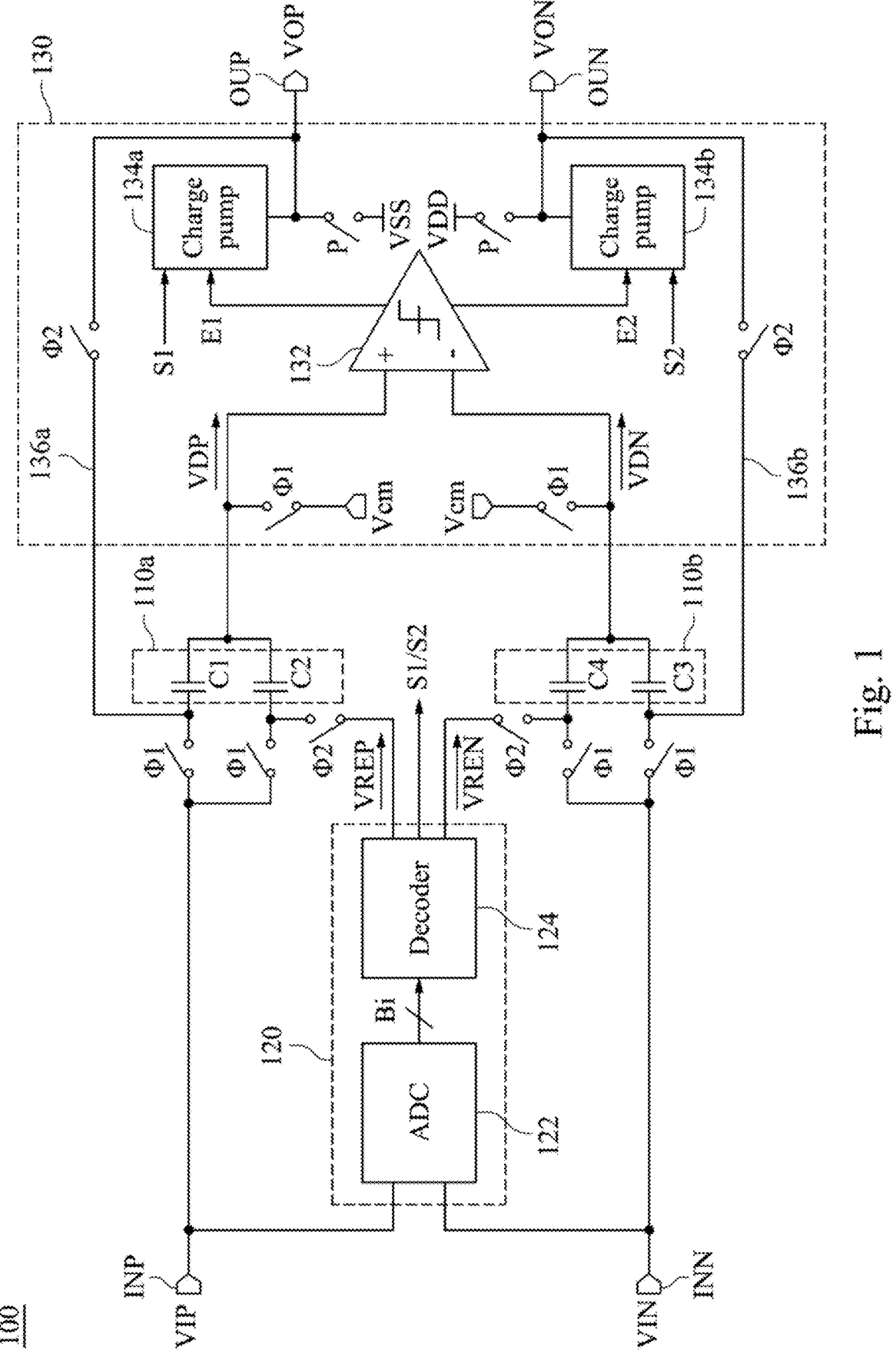
FIG. 1 is a simplified functional diagram of a switched-capacitor circuit according to one embodiment of the present disclosure.

Reference will now be made in detail to the present embodiments of the disclosure, examples of which are illustrated in the accompanying drawings.

Wherever possible, the same reference numbers are used in the drawings and the description to refer to the same or like parts.

FIG. 1 is a simplified functional diagram of a switched-capacitor circuit 100 according to one embodiment of the present disclosure. In some embodiments, the switched-capacitor circuit 100 can be used as one of a plurality of stages of a pipelined analog-to-digital converter (ADC). The switched-capacitor circuit 100 comprises a plurality of sampling capacitor arrays 110a-110b, a control circuit 120 and a charge-transfer circuit 130. The switched-capacitor circuit 100 is configured to adjust differential input voltages VIP and VIN to adjusted voltages VDP and VDN with smaller amplitudes, and configured to amplify the adjusted voltages VDP and VDN to differential output voltages VOP and VON, so as to prevent a post-stage circuit (e.g., a next stage of the pipelined ADC) from a dynamic distortion.

The sampling capacitor array 110a is configured to sample the input voltage VIP of an input terminal INP. In some embodiments, the sampling capacitor array 110a comprises capacitors C1-C2, wherein each of first terminals of the capacitors C1-C2 is coupled to the input terminal INP through a respective switch, and second terminals of the capacitors C1-C2 are coupled to the charge-transfer circuit 130. The sampling capacitor array 110b is configured to sample the input voltage VIN of an input terminal INN. In some embodiments, the sampling capacitor array 110b comprises capacitors C3-C4, wherein each of first terminals of the capacitors C3-C4 is coupled to the input terminal INN through a respective switch, and second terminals of the capacitors C3-C4 are coupled to the charge-transfer circuit 130.

In some embodiments, the control circuit 120 comprises an ADC 122 and a decoder 124. The ADC 122 is coupled to the input terminals INP and INN, and configured to generate a digital code Bi according to the input voltages VIP and VIN. The decoder 124 is coupled to the ADC 122, and configured to generate reference voltages VREP and VREN according to the digital code Bi. The reference voltages VREP and VREN are configured to be coupled to the sampling capacitor arrays 110a and 110b, respectively, so as to adjust the input voltages VIP and VIN sampled by the sampling capacitor arrays 110a and 110b, thereby generating the adjusted voltages VDP and VDN. In some embodiments, the decoder 124 comprises a digital-to-analog converter (DAC).

The charge-transfer circuit 130 comprises a comparator 132, charge pumps 134a-134b and feedback paths 136a-136b. A first input terminal of the comparator 132 (e.g., a non-inverting input terminal) is coupled to the second terminals of the capacitors C1-C2, so as to receive the adjusted voltage VDP. A second terminal of the comparator 132 (e.g., an inverting input terminal) is coupled to the second terminals of capacitor C3-C4, so as to receive the adjusted voltage VDN. The comparator 132 is configured to generate control signals E1 and E2 according to the adjusted voltages VDP and VDN, so as to use the control signals E1 and E2 to control the charge pumps 134a-134b, respectively. For example, when the adjusted voltages VDP and VDN are different, the comparator 132 uses the control signals E1 and E2 to enable the charge pumps 134a-134b. As another example, when the adjusted voltages VDP and VDN are the same, the comparator 132 uses the control signals E1 and E2 to disable the charge pumps 134a-134b.

The enabled charge pumps 134a-134b are configured to charge an output terminal OUP and discharge an output terminal OUN, respectively, so as to generate output voltages VOP and VON at the output terminals OUP and OUN, respectively. In addition, the decoder 124 is further configured to generate selection signals S1 and S2 according to the digital code Bi, so as to control current-voltage characteristics of the charge pumps 134a-134b, respectively.

Figure 2B:
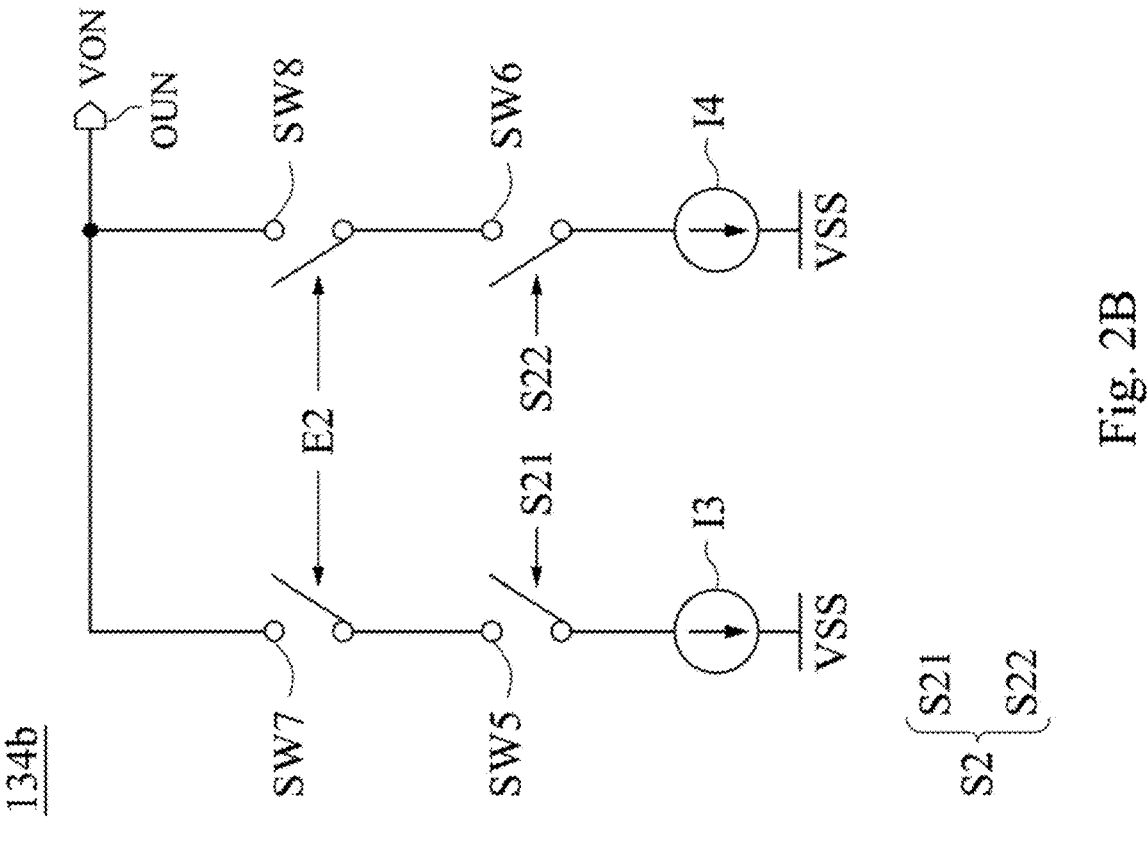
FIG. 2B is a circuit schematic diagram of a charge pump according to one embodiment of the present disclosure.
Figure 2A:
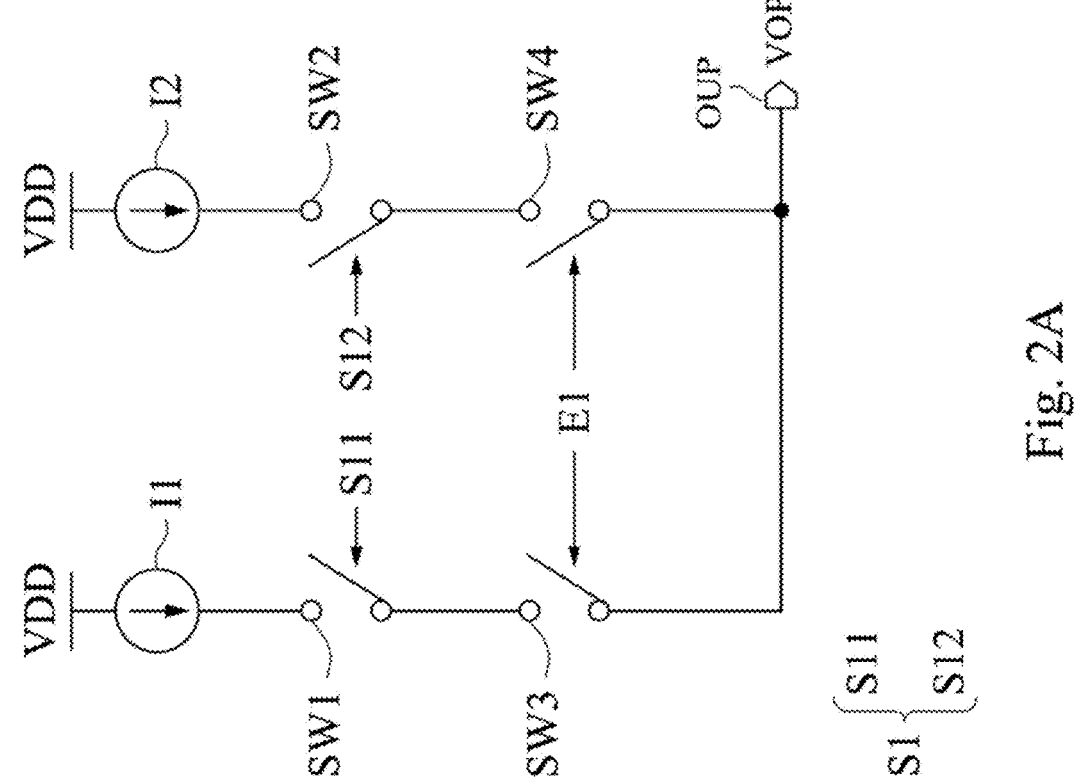
FIG. 2A is a circuit schematic diagram of a charge pump according to one embodiment of the present disclosure.

FIG. 2A is a circuit schematic diagram of the charge pump 134a according to one embodiment of the present disclosure. The charge pump 134a comprises a plurality of current sources I1 and I2 and a plurality of switches SW1-SW4. The current source I1, the switch SW1 and the switch SW3 are coupled in series between a high working voltage VDD and the output terminal OUP. The current source I2, the switch SW2 and the switch SW4 are coupled in series between the high working voltage VDD and the output terminal OUP. The selection signal S1 comprises sub-selection signals S11 and S12, and the sub-selection signals S11 and S12 are configured to control switches SW1 and SW2, respectively. The switches SW3 and SW4 are controlled by the control signal E1.

FIG. 2B is a circuit schematic diagram of the charge pump 134b according to one embodiment of the present disclosure. The charge pump 134b comprises a plurality of current sources I3 and I4 and a plurality of switches SW5-SW8. The current source I3, the switch SW5 and the switch SW7 are coupled in series between a low working voltage VSS and the output terminal OUN. The current source I4, the switch SW6 and the switch SW8 are coupled in series between the low working voltage VSS and the output terminal OUN. The selection signal S2 comprises sub-selection signals S21 and S22, and the sub-selection signals S21 and S22 are configured to control switches SW5 and SW6, respectively. The switches SW7 and SW8 are controlled by the control signal E2.

Figures 3A, 3B:
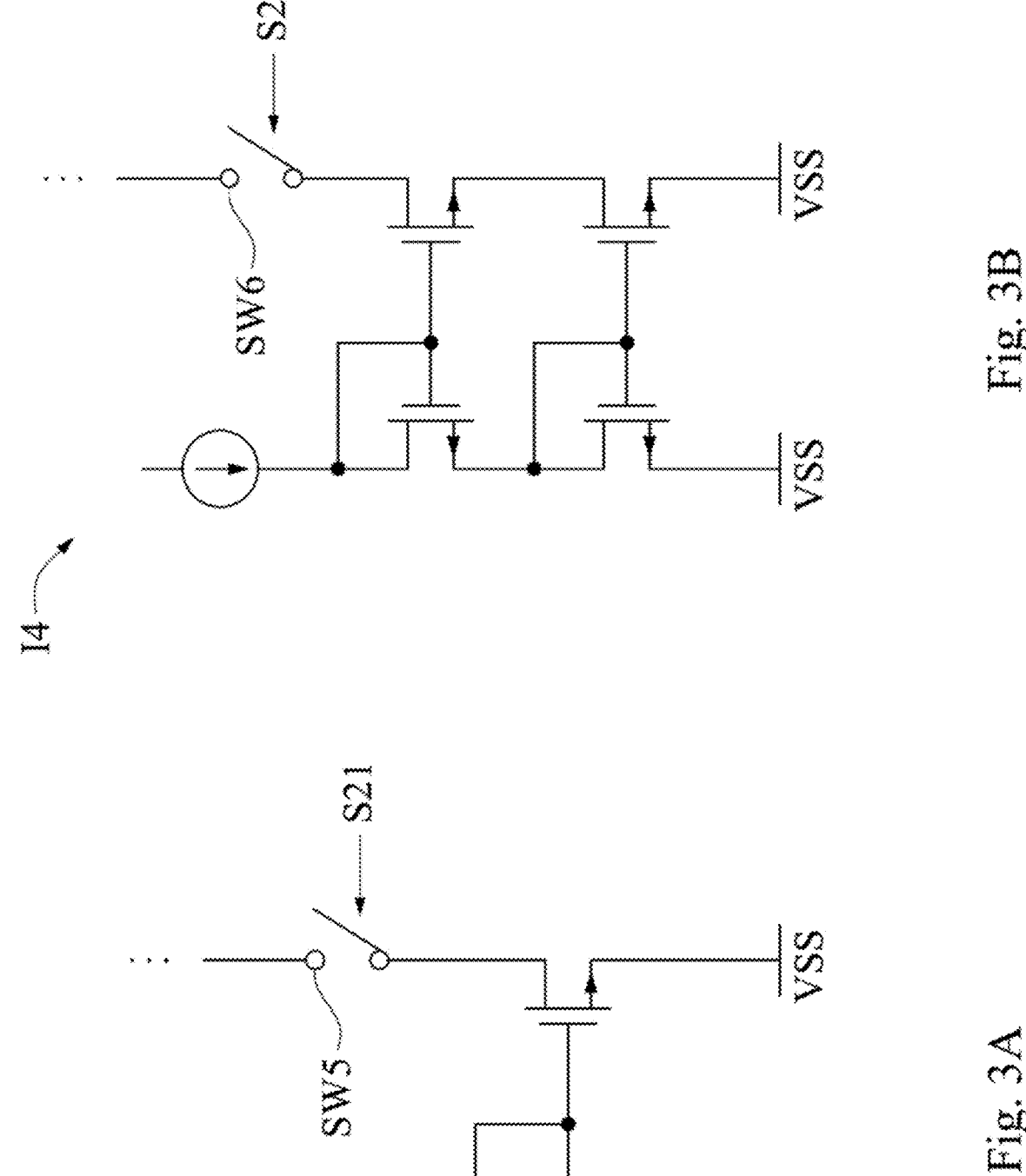
FIG. 3A is a circuit schematic diagram of a current source according to one embodiment of the present disclosure.
FIG. 3B is a circuit schematic diagram of a current source according to one embodiment of the present disclosure.

In some embodiments, the current sources I1 and I2 have different current-voltage characteristics and/or structures; the current sources I3 and I4 have different current-voltage characteristics and/or structures. In some embodiments, the current sources I1-I4 have approximately the same output currents, that is, errors between the output currents of the current sources I1-I4 can be within 20%, preferably within 10%, and more preferably within 5%. In some embodiments, the current source I3 is a basic current mirror of N-type transistor shown in FIG. 3A, and the current source I4 is a cascode current mirror of N-type transistor shown in FIG. 3B. The current sources I1 and I2 are also current mirror and cascode current mirror, respectively, the only difference is that the current sources I1 and I2 are implemented with P-type transistors. For simplicity, the detailed descriptions thereof are omitted here.

Figure 4:
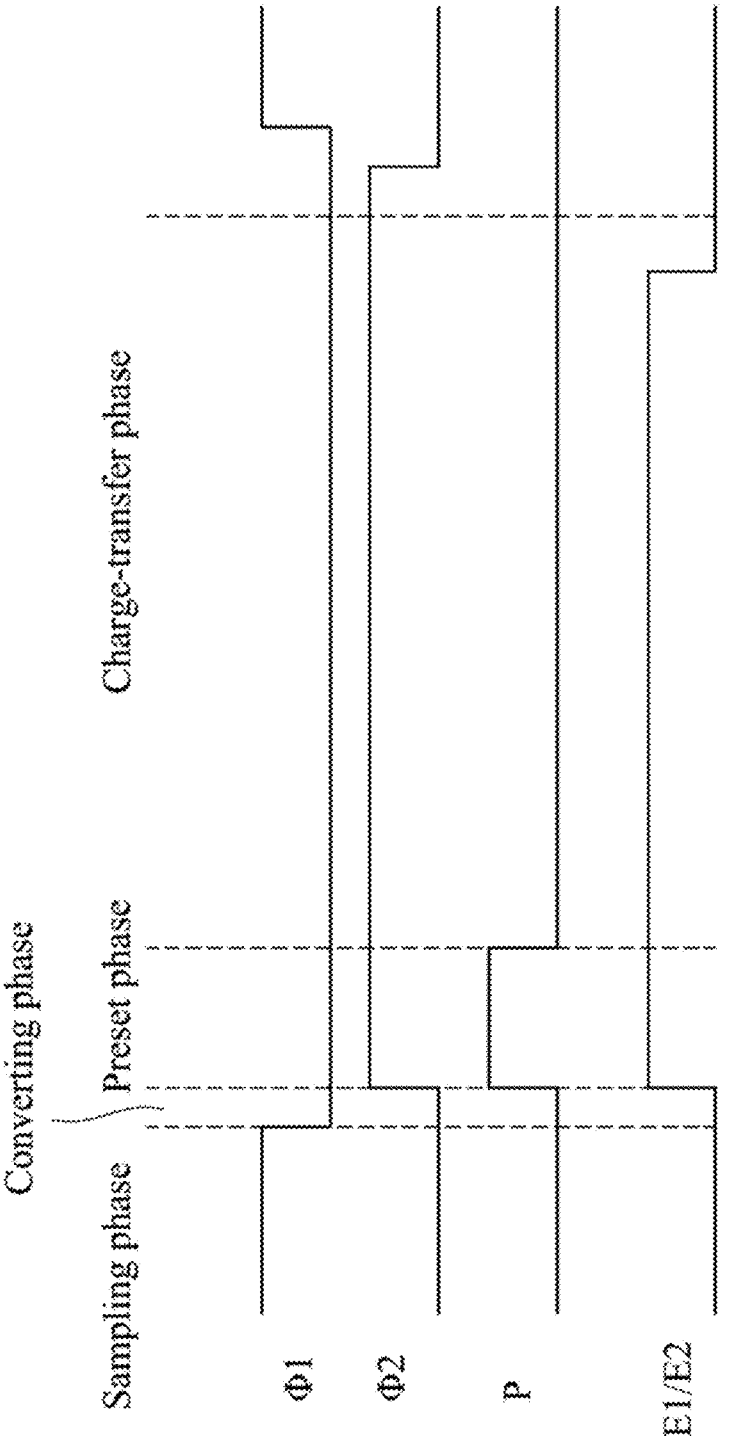
FIG. 4 is a schematic diagram of waveforms of a switched-capacitor circuit according to one embodiment of the present disclosure.

FIG. 4 is a schematic diagram of waveforms of the switched-capacitor circuit 100 according to one embodiment of the present disclosure. In the present disclosure, an enabling level and a disabling level of a signal are configured to conduct and switch off corresponding switches, respectively. At first, in the sampling phase, a switching signal ϕ1 is in the enabling level, and a switching signal ϕ2, a preset signal P and control signals E1-E2 are in the disabling level. The first terminals of the capacitors C1-C2 are connected to the input terminal INP to receive (sample) the input voltage VIP. The first terminals of the capacitors C3-C4 are connected to the input terminal INN to receive (sample) the input voltage VIN. In addition, the second terminals of the capacitors C1-C4, the first input terminal of the comparator 132 and the second input terminal of the comparator 132 all receive a common voltage Vcm.

In the converting phase, the switching signals φ1-φ2, the preset signal P and the control signals E1-E2 are all in the disabling level. According to the input voltages VIN and VIP, the decoder 124 will: (1) determine the magnitude of the reference voltages VREP and VREN; (2) select one of the current sources I1 and I2 to be enabled in the aftermentioned charge-transfer phase; and (3) select one of the current sources I3 and I4 to be enabled in the aftermentioned charge-transfer phase.

Figure 5:
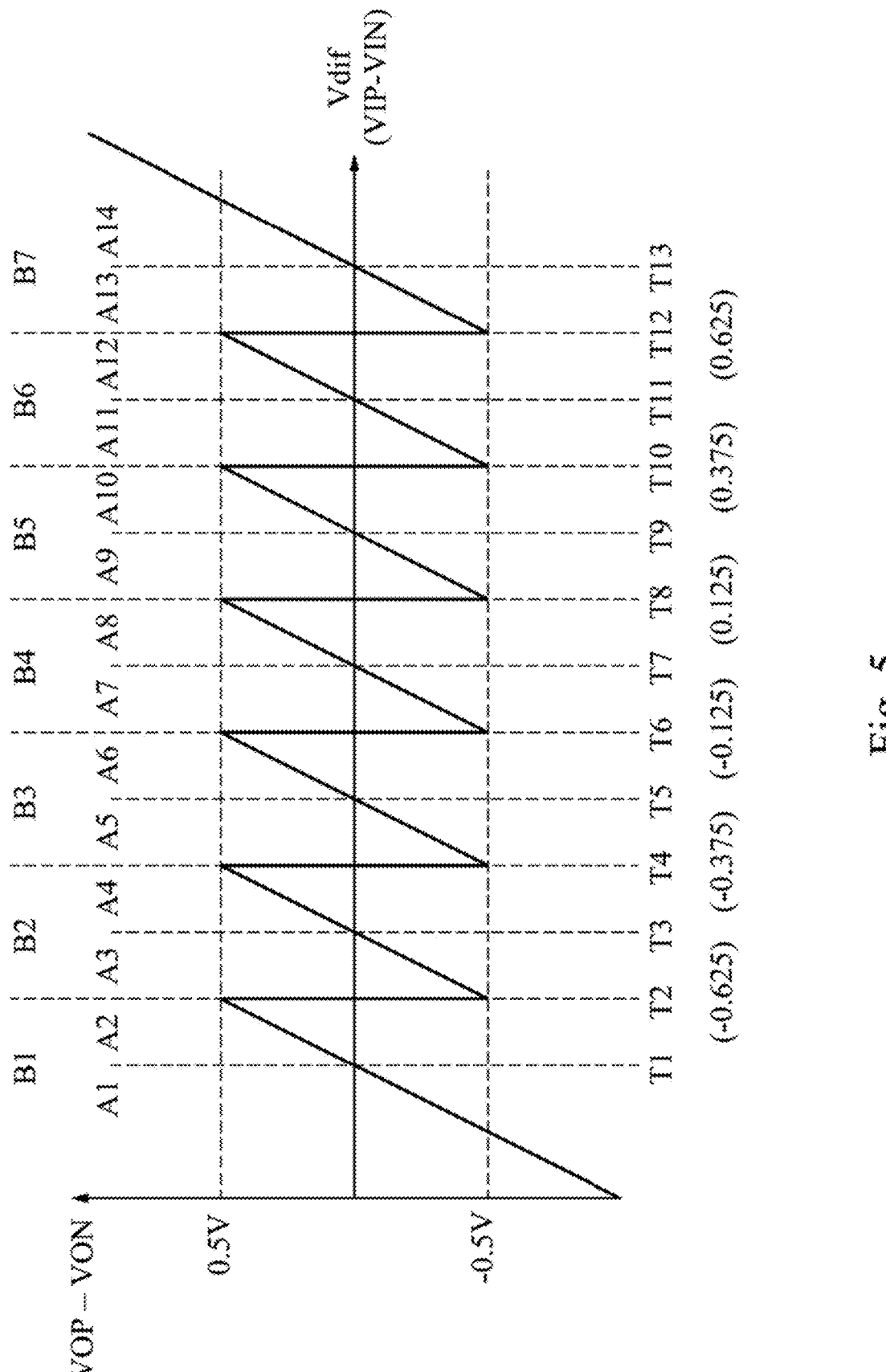
FIG. 5 is a schematic diagram of an input-output characteristic of a switched-capacitor circuit according to one embodiment of the present disclosure.

Referring also to FIG. 5, FIG. 5 is a schematic diagram of an input-output characteristic of the switched-capacitor circuit 100 according to one embodiment of the present disclosure. The vertical axis of FIG. 5 is a difference obtained by subtracting the output voltage VON from the output voltage VOP, and the horizontal axis is a difference obtained by subtracting the input voltage VIN from the input voltage VIP (hereinafter refer to as the "input voltage difference Vdif"). In some embodiments, the ADC 122 comprises a plurality of comparators (not depicted), wherein these comparators correspond to a plurality of voltage thresholds T1-T13 in FIG. 5, respectively, and the voltage thresholds T1-T13 are arranged in ascending order. The voltage thresholds T1-T13 define a plurality of voltage ranges A1-A14. The number of the voltage thresholds T1-T13 is merely an example, and the present disclosure is not limited thereto.

The ADC 122 is configured to use the plurality of comparators to compare the input voltage difference Vdif with the voltage thresholds T1-T13. Therefore, the ADC 122 can determine the voltage range including the input voltage difference Vdif from the voltage ranges A1-A14, and then output the digital code Bi representing the voltage range. For example, when the input voltage difference Vdif is in the voltage range A1, the digital code Bi that the ADC 122 outputs is 0001; when the input voltage input voltage difference Vdif is in the voltage range A2, the digital code Bi that the ADC 122 outputs is 0010, and so on.

When the input voltage difference Vdif is in a voltage range denoted by an odd number (e.g., the voltage ranges A1, A3, etc.), it means that after the aftermentioned charge-transfer phase, the output voltage VOP will be smaller than the output voltage VON. For example, the output voltage VOP is smaller than the common voltage Vcm (e.g., 0.5 V), and the output voltage VON is larger than or equal to the common voltage Vcm. In this situation, according to the digital code Bi, the decoder will determine that the current sources I1 and I3 should be ennabled in the charge-transfer phase (i.e., the switches SW1 and SW5 should be conducted), and the current sources I2 and I4 should be disabled in the charge-transfer phase (i.e., the switches SW2 and SW6 should be switched off).

On the other hand, when the input voltage difference Vdif is in a voltage range denoted by an even number (e.g., the voltage ranges A2, A4, etc.), it means that after the aftermentioned charge-transfer phase, the output voltage VOP will be larger than the output voltage VON. For example, the output voltage VOP is larger than or equal to the common voltage Vcm, and the output voltage VON is smaller than the common voltage Vcm. According to the digital code Bi, the decoder 124 will determine that the current sources I2 and I4 should be enabled in the charge-transfer phase (i.e., the switches SW2 and SW6 should be conducted), and the current sources I1 and I3 should be disabled in the charge-transfer phase (i.e., the switches SW1 and SW5 should be switched off).

In other words, when the input voltage difference Vdif is in an M-th voltage range of the voltage ranges A1-A14, and when the output voltage VOP is smaller than the output voltage VON, the decoder 124 will enable the current sources I1 and I3 in the charge-transfer phase. When the input voltage difference Vdif is in an (M+1)-th voltage range of the voltage ranges A1-A14, and when the output voltage VOP is larger than the output voltage VON, the decoder 124 will enable the current sources I2 and I4 in the charge-transfer phase, wherein M is a positive integer.

In other words, when the input voltage difference Vdif is adjacent to a J-th voltage threshold of the voltage thresholds T1-T13 (e.g., a first voltage threshold T1), and is smaller than the J-th voltage threshold, it means that after the aftermentioned charge-transfer phase, the output voltage VOP will be smaller than the output voltage VON. In this situation, the decoder 124 will enable the current sources I1 and I3 in the charge-transfer phase, wherein J is an odd number. When the input voltage difference Vdif is adjacent to the J-th voltage threshold, and is larger than or equal to the J-th voltage threshold, it means that after the aftermentioned charge-transfer phase, the output voltage VOP will be larger than the output voltage VON. In this situation, the decoder 124 will enable the current sources I2 and I4 in the charge-transfer phase.

Accordingly, the decoder 124 is configured to determine which voltage range in the voltage ranges A1-A14 that the input voltage difference Vdif is in according to the digital code Bi, and determine an operating state (i.e., enabled or disabled) of each of the current sources I1-I4 in the charge-transfer phase according to the determination result regarding the voltage range.

In addition, the decoder 124 is configured to determine which voltage range in the voltage ranges B1-B7 that the input voltage difference Vdif is in according to the digital code Bi, and determine magnitude of the reference voltages VREP and VREN according to the determination result regarding the voltage range. The voltage range B1 is composed of the voltage ranges A1 and A2; the voltage range B2 is composed of the voltage ranges A3 and A4, and so on.

In some embodiments, the relationships between the reference voltages VREP and VREN, the input voltage difference Vdif and the voltage ranges B1-B7 are shown in the following Table 1.

TABLE 1

| Voltage range | Reference voltage VREP | Reference voltage VREN |
|---|---|---|
| B1 | 0 V | 1 V |
| B2 | 0 V | (2/3) V |
| B3 | 0 V | (1/3) V |
| B4 | 0 V | 0 V |
| B5 | (1/3) V | 0 V |
| B6 | (2/3) V | 0 V |
| B7 | 1 V | 0 V |

Then, in the preset phase, the switching signal φ2, the preset signal P and the control signals E1-E2 are in the enabling level. The switching signal φ1 is in the disabling level. In this phase, the control circuit 120 is configured to output the reference voltage VREP correlated to the magnitude of the input voltage VIP to the sampling capacitor array 110a, so as to adjust the input voltage VIP sampled by the sampling capacitor array 110a according to the magnitude of the input voltage VIP, thereby generating the adjusted voltage VDP. The control circuit 120 is further configured to output the reference voltage VREN correlated to the magnitude of the input voltage VIN to the sampling capacitor array 110b, so as to adjust the input voltage VIN sampled by the sampling capacitor array 110b according to the magnitude of the input voltage VIN, thereby generating the adjusted voltage VDN.

More specifically, in the preset phase, the comparator 132 along with the output terminals OUP and OUN form a closed loop. The control circuit 120 couples the reference voltages VREP and VREN to a first terminal of the capacitor C2 and a first terminal of the capacitor C4 through the switches, respectively (i.e., couple to the input voltage VIP sampled by the sampling capacitor array 110a, and couple to the input voltage VIN sampled by the sampling capacitor array 110b). Accordingly, the input voltage VIP sampled by the capacitors C1 and C2 is adjusted to the adjusted voltage VDP, and the input voltage VIN sampled by the capacitors C3 and C4 is adjusted to the adjusted voltage VDN. In addition, in the preset phase, the charge-transfer circuit 130 is configured to reset the output terminal OUP to a low working voltage VSS, and configured to reset the output terminal OUN to a high working voltage VDD.

In the charge-transfer phase, the switching signal φ2 and the control signals E1-E2 are in the enabling level, the switching signal φ1 and the preset signal P are in the disabling level. Through the cooperation between the comparator 132, the charge pump 134a and the charge pump 134b, in the charge-transfer phase, the charge-transfer circuit 130 is configured to amplify the adjusted voltages VDP and VDN, so as to generate the output voltages VOP and VON at output terminals OUP and OUN. More specifically, the comparator 132 is configured to compare the adjusted voltages VDP and VDN, and to control the charge pumps 134a-134b according to the comparing result. As mentioned earlier, when the reference voltages VREP and VREN are different, the comparator 132 will enable charge pumps 134a-134b (i.e., conducts the switches SW3-SW4 and SW7-SW8). At the same time, the decoder 124 will enable the selected current sources (e.g., conducts switches SW1 and SW5 to enable the combination of current sources I1 and I3, or conducts switches SW2 and SW6 to enable the combination of current sources I2 and I4), so that the charge pumps 134a-134b start charging and discharging the output terminals OUP and OUN, so as to generate the output voltages VOP and VON. On the other hand, when the variations of the reference voltages VREP and VREN are the same, the comparator 132 will switch the control signals E1-E2 to the disabling level, so as to disable the charge pumps 134a-134b (i.e., to switch off the switches SW3-SW4 and SW7-SW8).

Accordingly, when the decoder 124 determines that the output voltage VOP will be smaller than the output voltage VON in the end, the current sources I1 and I3 with simpler structures will be configured to charge and discharge the output terminals OUP and OUN, respectively. On the other hand, when the decoder 124 determines that the output voltage VOP will be larger than the output voltage VON in the end, the current sources I2 and I4 with more complex structures will be configured to charge and discharge the output terminals OUP and OUN, respectively.

To sum up, in the sampling phase, the sampling capacitor arrays 110a-110b are configured to sample the input voltages VIP and VIN, respectively. In the converting phase, according to the relationship between the input voltages VIN and VIP and the plurality of voltage thresholds T1-T13 in FIG. 5 (e.g., comparing the input voltage difference Vdif between the input voltages VIN and VIP with the plurality of voltage thresholds T1-T13), the control circuit 120 is configured to:

(1) determine the magnitude of the reference voltages VREP and VREN; (2) select one of the current sources I1 and I2 (e.g., the current source I1) to be enabled in the following charge-transfer phase; and (3) select one of the current sources I3 and I4 (e.g., the current source I3) to be enabled in the following charge-transfer phase.

In the preset phase, the control circuit 120 is configured to adjust the input voltage VIP sampled by the sampling capacitor array 110a according to the magnitude of the input voltage VIP so as to generate the adjusted voltage VDP. The control circuit 120 is further configured to adjust the input voltage VIN sampled by the sampling capacitor array 110b according to the magnitude of the input voltage VIN so as to generate the adjusted voltage VDN. More specifically, the control circuit 120 is configured to couple the reference voltage VREP to the input voltage VIP sampled by the sampling capacitor array 110a to generate the adjusted voltage VDP, and the control circuit 120 is configured to couple the reference voltage VREN to the input voltage VIN sampled by the sampling capacitor array 110b to generate the adjusted voltage VDN. In addition, in the preset phase, the charge-transfer circuit 130 will provide the low working voltage VSS and the high working voltage VDD to the output terminals OUP and OUN, respectively.

In the charge-transfer phase, according to the input voltages VIN and VIP (i.e., the selection result in the converting phase), the control circuit 120 enables one of the current sources I1 and I2 (e.g., the current source I1) and one of the current sources I3 and I4 (e.g., the current source I3), so that the charge-transfer circuit 130 amplifies the adjusted voltages VDP and VDN in the charge-transfer phase to generate the output voltages VOP and VON at the output terminals OUP and OUN.

Figure 6:
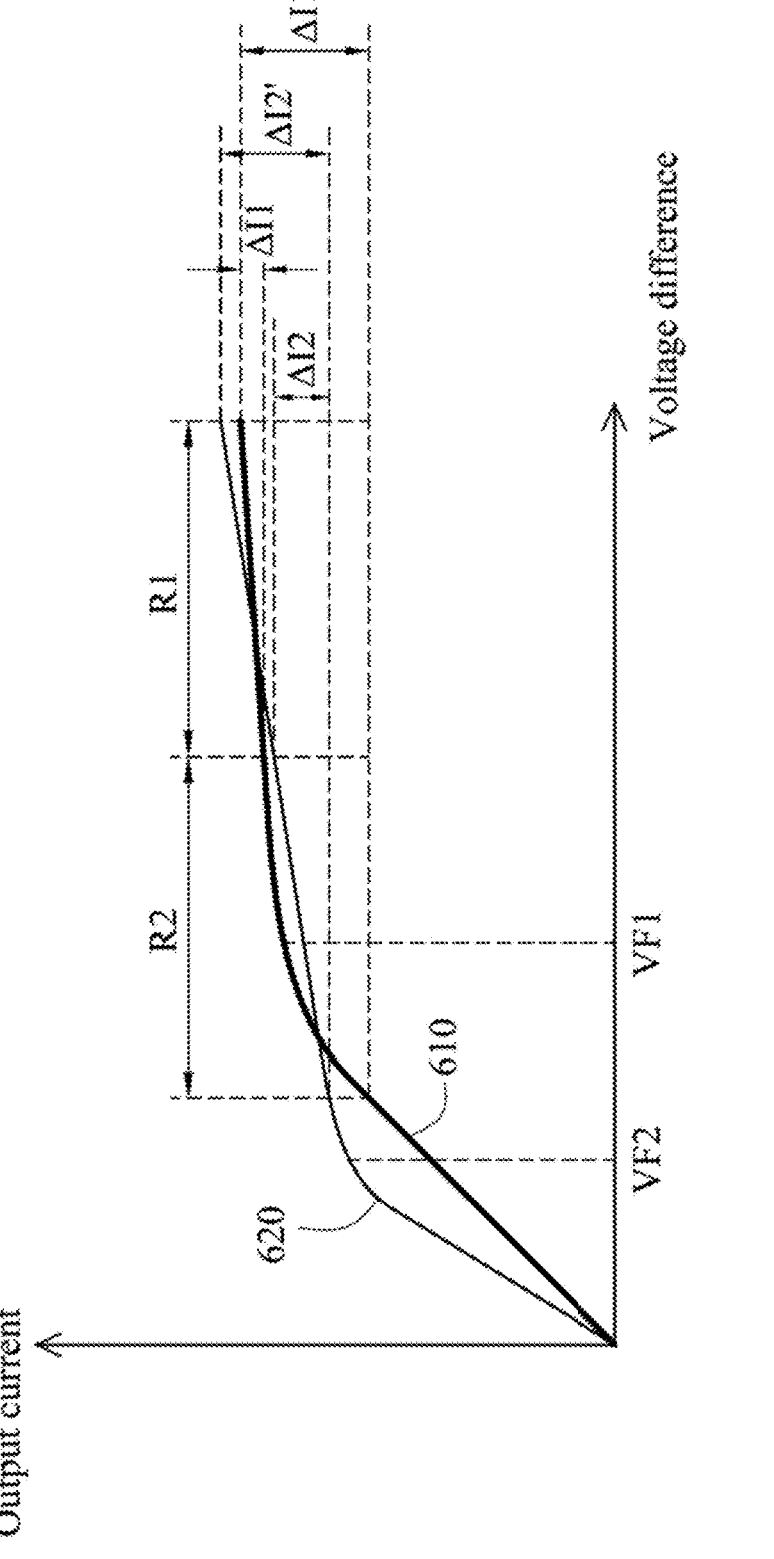
FIG. 6 is a schematic diagram of current-voltage characteristics of current sources according to one embodiment of the present disclosure.

FIG. 6 is a schematic diagram of current-voltage characteristics of the current sources I1 and I2 according to one embodiment of the present disclosure. In FIG. 6, the vertical axis is an output current of a current source (e.g., the current outputted to the output terminal OUP), and the horizontal axis is a voltage difference applied to the current source (e.g., a difference between the high working voltage VDD and the output voltage VOP). Characteristic curves of the current sources I1 and I2 are curves 610 and 620, respectively.

Each of the current sources I1 and I2 enters its own saturation region from a linear region under voltage differences VF1 and VF2 respectively, wherein the voltage difference VF1 is larger than the voltage difference VF2. Affected by the channel effect, output currents of the current sources I1 and I2 in the saturation regions will change according to the voltage difference. The magnitude of the output current variation generated by the current source I1 when the current source I1 is operated at a first saturation region (i.e., the region of the horizontal axis after the voltage difference VF1) and receives a first voltage difference variation, is smaller than the magnitude of the output current variation generated by the current source I2 when the current source I2 is operated at a second saturation region (i.e., the region of the horizontal axis after the voltage difference VF2) and receives the same first voltage difference variation. The current source I3 and the current source I4 may also have the aforementioned output current characteristics, that is, when a second voltage difference variation is applied to the current source I3 operated at a third saturation region and the current source I4 operated at a fourth saturation region, the magnitude of the output current variation generated by the current source I3 is smaller than the magnitude of the output current variation generated by the current source I4.

In other words, the slope of the curve 610 in the saturation region thereof is smaller than the slope of the curve 620 in the saturation region thereof. In some embodiments, the aforementioned "current-voltage characteristics" includes but not limited to (1) a voltage difference required to make a current source enter a saturation region from a linear region; and (2) an output current variation of a current source operated in the saturation region, under a fixed variation of the voltage difference.

As mentioned before, when the decoder 124 determines that the output voltage VOP is smaller than the output voltage VON, the current source I1 will be enabled, and the current source I1 will mainly be operated in a region R1 with a larger voltage difference. On the other hand, when the decoder 124 determines that the output voltage VOP is larger than the output voltage VON, the current source I2 will be enabled, and the current source I2 will mainly be operated in a region R2 with a smaller voltage difference. Therefore, comparing the output currents of the charge pump 134a under two situations that the output voltage VOP having a maximum value and a minimum value, the current variation of the charge pump 134a is only ΔI1+ΔI2. By contrast, in an example that the charge pump 134a includes only the current source I1, the charge pump 134a has a larger current varianve ΔI1'. In an example that the charge pump 134a includes only the current source 12, the charge pump 134a also has a larger current variation ΔI2'.

Accordingly, enabling the current source I1 or I2 adaptively according to the output voltage VOP will reduce the current variation of the charge pump 134a. The current-voltage characteristics of the current sources I3 and I4 are similar to those of the current sources I1 and I2, respectively. Therefore, the current variation of the charge pump 134b may also be reduced by a similar operation. For simplicity, the detailed descriptions thereof are omitted here. Through reducing the current variations of the charge pumps 134a and 134b, the switched-capacitor circuit 100 can have an advantage of high linearity.

Figure 7:
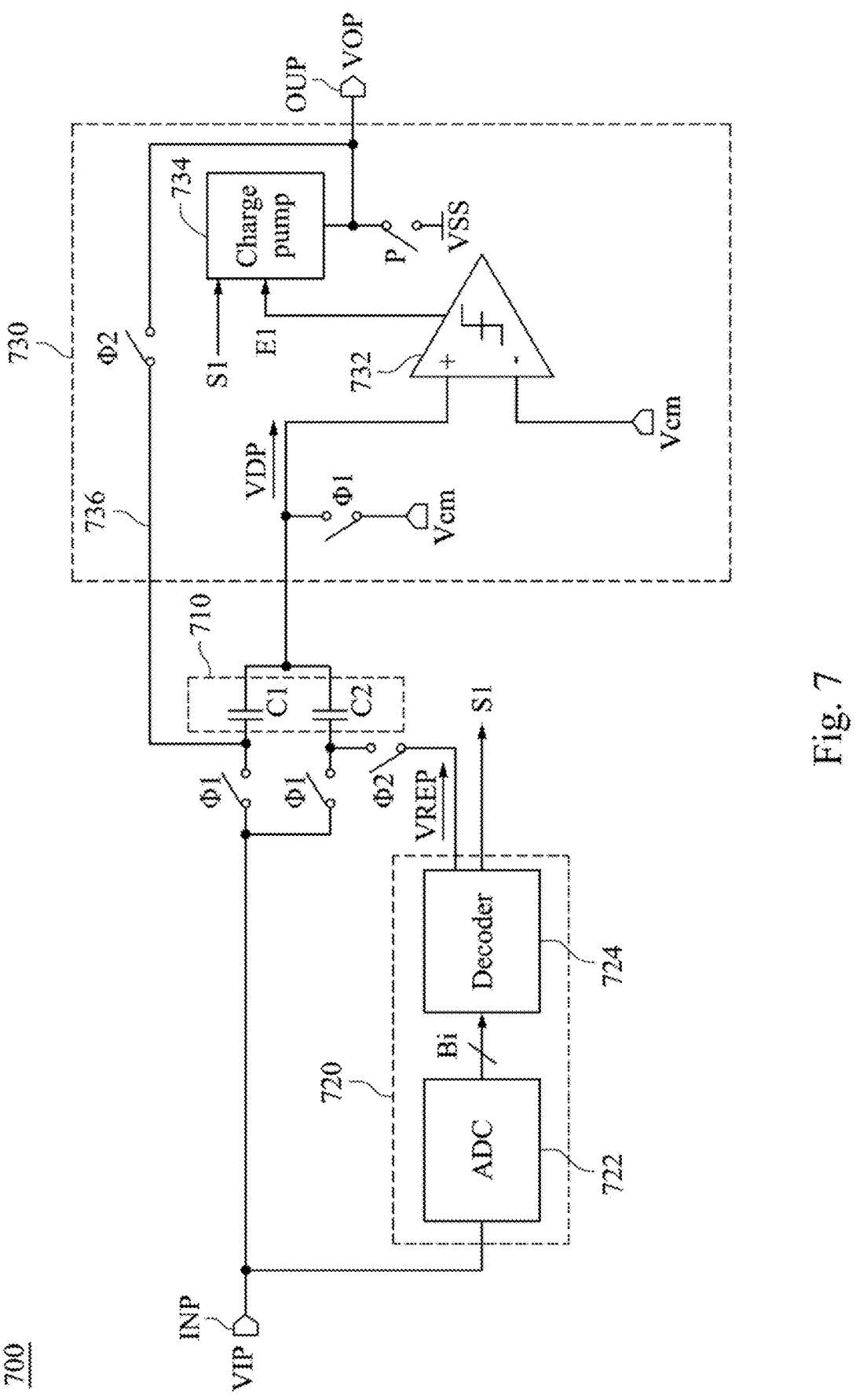
FIG. 7 is a simplified functional diagram of a switched-capacitor circuit according to one embodiment of the present disclosure.

FIG. 7 is a simplified functional diagram of a switched-capacitor circuit 700 according to one embodiment of the present disclosure. The switched-capacitor circuit 700 comprises a sampling capacitor array 710, a control circuit 720 and a charge-transfer circuit 730. The sampling capacitor array 710 is similar to the sampling capacitor array 110a in FIG. 1, for simplicity, the detailed descriptions thereof are omitted here. The control circuit 720 comprises an ADC 722 and a decoder 724. The ADC 722 is coupled to the input terminal INP and configured to generate the digital code Bi according to the input voltage VIP. The decoder 724 is coupled to the ADC 722 and configured to generate the reference voltage VREP according to the digital code Bi. The reference voltage VREP is coupled to the sampling capacitor array 710 so as to generate the adjusted voltage VDP.

The charge-transfer circuit 730 comprises a comparator 732, a charge pump 734 and a feedback path 736. A first input terminal (e.g., a non-inverting input terminal) of the comparator 732 is coupled to second terminals of the capacitors C1-C2, so as to receive the adjusted voltage VDP. A second input terminal (e.g., an inverting input terminal) of the comparator 732 is configured to receive a common voltage Vcm. The comparator 732 is configured to generate a control signal E1 according to the adjusted voltage VDP and the common voltage Vcm, so as to use the control signal E1 to control the charge pump 734. For example, when the adjusted voltage VDP and the common voltage Vcm are different, the comparator 732 uses the control signal E1 to enable the charge pump 734. As another example, when the adjusted voltage VDP and the common voltage Vcm are the same, the comparator 732 uses the control signal E1 to disable the charge pump 734. The charge pump 734 and the feedback path 736 are similar to the charge pump 134a and the feedback path 136a in FIG. 1, respectively. For simplicity, the detailed descriptions thereof are omitted here.

Figure 8:
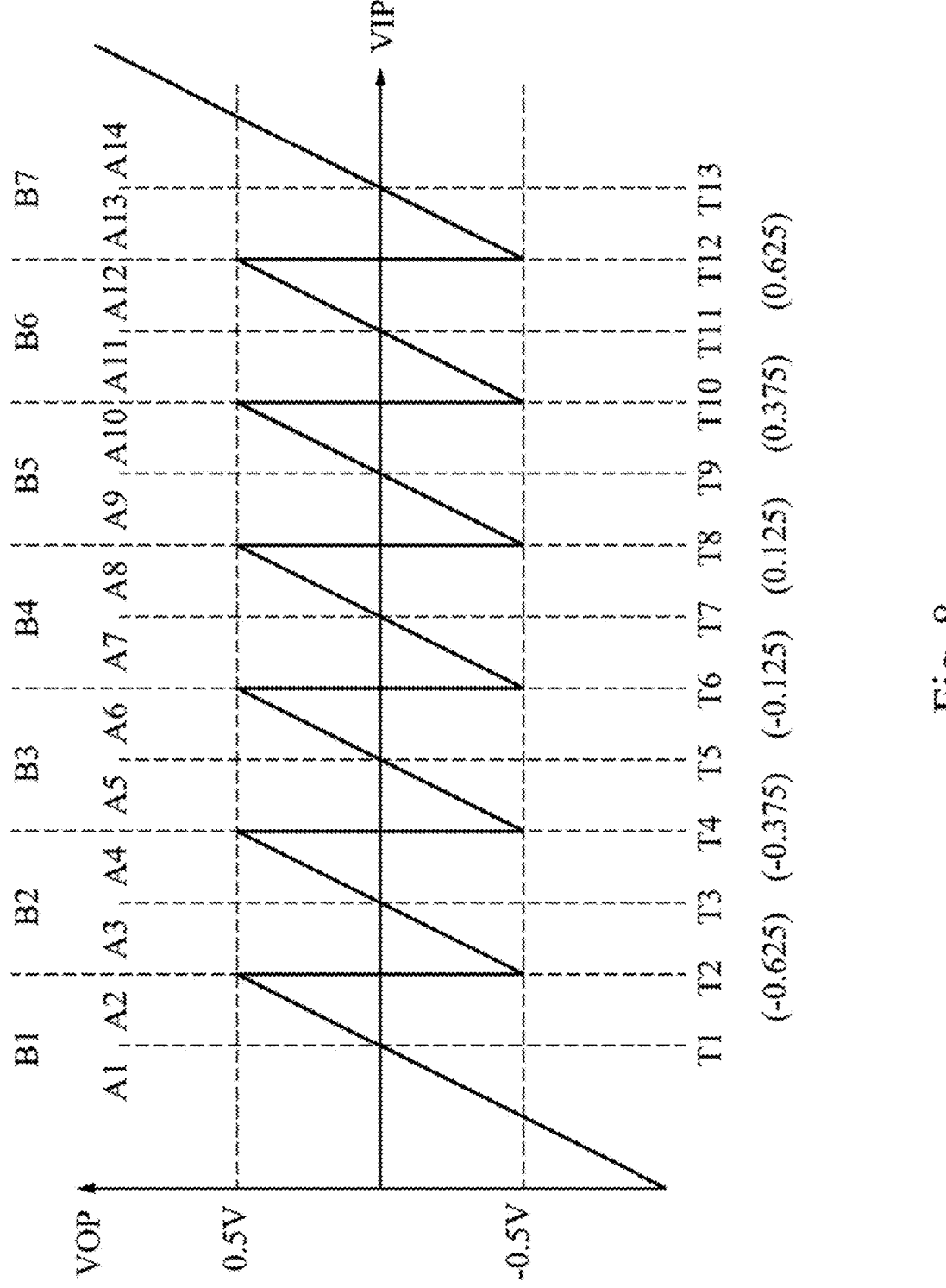
FIG. 8 is a schematic diagram of an input-output characteristic of a switched-capacitor circuit according to one embodiment of the present disclosure.

Referring also to FIG. 8, FIG. 8 is a schematic diagram of an input-output characteristic of the switched-capacitor circuit 700 according to one embodiment of the present disclosure. FIG. 8 is similar to FIG. 5; the difference is that the vertical axis and the horizontal axis of FIG. 8 are the output voltage VOP and the input voltage VIP, respectively. The ADC 722 is configured to use a plurality of comparators to compare the input voltage VIP with the plurality of voltage thresholds T1-T13. Accordingly, the ADC 722 can determine a voltage range including the input voltage VIP from the plurality of voltage ranges A1-A14, and output the digital code Bi representing the voltage range.

The decoder 724 is configured to determine which voltage range of the voltage ranges A1-A14 that the input voltage VIP is in according to the digital code Bi, and determine an operating state (i.e., enabled or disabled) of each of the current sources I1-I2 in the charge-transfer phase according to the determination result regarding the voltage range. When the input voltage VIP is in a voltage range denoted by an odd number (e.g., the voltage ranges A1, A3, etc.), according to the digital code Bi, the decoder 724 will determine that the current source I1 should be enabled in the charge-transfer phase, and determine that the current source I2 should be disabled in the charge-transfer phase. On the other hand, when the input voltage VIP is in a voltage range denoted by an even number (e.g., the voltage range A2 or A4, etc.), according to the digital code Bi, the decoder 724 will determine that the current source I1 should be disabled in the charge-transfer phase, and determine that the current source I2 should be enabled in the charge-transfer phase.

In other words, when the input voltage VIP is in an M-th voltage range of the voltage ranges A1-A14, and the output voltage VOP is smaller than the common voltage Vcm, the decoder 724 will enable the current source I1. When the input voltage VIP is in an (M+1)-th voltage range of the voltage ranges A1-A14, and the output voltage VOP is larger than or equal to the common voltage Vcm, the decoder 724 will enable the current source 12, wherein M is a positive integer.

In other words, when the input voltage VIP is adjacent to a J-th voltage threshold of the voltage thresholds T1-T13 (e.g., the first voltage threshold T1), and is smaller than the J-th voltage threshold, it means that after the aftermentioned charge-transfer phase, the output voltage VOP will be smaller than the common voltage Vcm. In this situation, the decoder 724 will enable the current source I1 and disable the current source 12, wherein J is an odd number. When the input voltage VIP is adjacent to the J-th voltage threshold, and is larger than or equal to the J-th voltage threshold, it means that after the aftermentioned charge-transfer phase, the output voltage VOP will be larger than or equal to the common voltage Vcm. In this situation, the decoder 724 will disable the current source I1 and enable the current source I2.

Other operation methods and advantages of the control circuit 720 and the charge-transfer circuit 730 are similar to the control circuit 120 and the charge-transfer circuit 130 in FIG. 1, respectively. For simplicity, the detailed descriptions thereof are omitted here.

Accordingly, in the sampling phase, the sampling capacitor array 710 is configured to sample the input voltage VIP. In the converting phase, according to the relationship between the input voltage VIP and the plurality of voltage thresholds T1-T13 in FIG. 8 (e.g., comparing the input voltage VIP with the plurality of voltage thresholds T1-T13), the control circuit 720 is configured to: (1) determine the magnitude of the reference voltage VREP; and (2) select one of the current sources I1 and I2 (e.g., the current source I1) to be enabled in the following charge-transfer phase.

In the preset phase, the control circuit 720 is configured to adjust the input voltage VIP sampled by the sampling capacitor array 710 according to the magnitude of the input voltage VIP, so as to generate the adjusted voltage VDP. More specifically, the control circuit 720 is configured to couple the reference voltage VREP to the input voltage VIP sampled by the sampling capacitor array 710, so as to generate the adjusted voltage VDP. In addition, the charge-transfer circuit 730 will provide the low working voltage VSS to the output terminal OUP in the preset phase.

In the charge-transfer phase, the control circuit 720 enables one of the current sources I1 and I2 (e.g., the current source I1) according to the input voltage VIP (i.e., the selection result in the converting phase), so that the charge-transfer circuit 730 amplifies the adjusted voltage VDP in the charge-transfer phase, in order to generate the output voltage VOP at the output terminal OUP.

Figure 9:
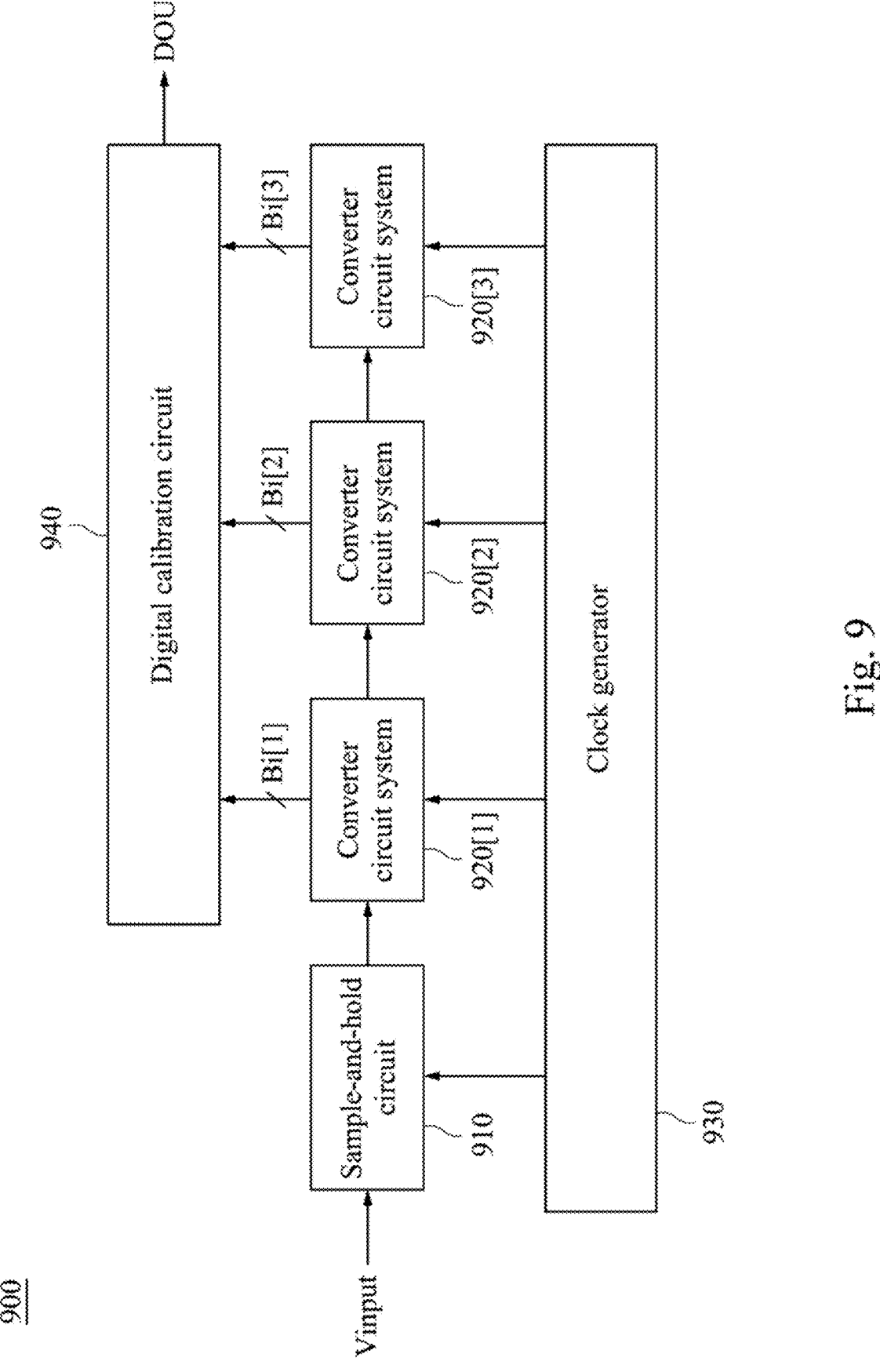
FIG. 9 is a simplified functional diagram of a pipelined analog-to-digital converter according to one embodiment of the present disclosure.

FIG. 9 is a simplified functional diagram of a pipelined ADC 900 according to one embodiment of the present disclosure. The pipelined ADC 900 comprises a sample-and-hold circuit 910, a plurality of converter circuit systems 920[1]-920[3], a clock generator 930 and a digital calibration circuit 940. The sample-and-hold circuit 910 is configured to sample an input signal Vinput.

The converter circuit systems 920[1]-920[3] are configured to sequentially convert outputs of previous stages to a plurality of digital codes Bi[1]-Bi[3], wherein the converter circuit system 920[1] is configured to convert the sampling result of the sample-and-hold circuit 910 to the input signal Vinput. The number of the converter circuit systems 920[1]~920[3] is merely an example, and the present disclosure is not limited thereto.

The clock generator 930 is configured to generate a plurality of clock signals to the sample-and-hold circuit 910 and the converter circuit systems 920[1]-920[3], so that the sample-and-hold circuit 910 and the converter circuit systems 920[1]-920[3] conduct the aforementioned operations according to the clock signals. The digital calibration circuit 940 is configured to combine the digital codes Bi[1]-Bi[3] to generate a digital code DOUT. In some embodiments, the digital calibration circuit 940 is further configured to calibrate offset errors and/or gain errors of the converter circuit systems 920[1]-920[3].

In some embodiments, each of the converter circuit systems 920[1]-920[3] can be implemented by the switched-capacitor circuit 100 in FIG. 1. For example, the output voltage of the switched-capacitor circuit 100 can be used as an input voltage of a converter circuit system of the next stage, and the digital code Bi generated by the switched-capacitor circuit 100 can be used as the corresponding one of the digital codes Bi[1]-Bi[3]. In other embodiments, each of the converter circuit systems 920[1]-920[3] can be implemented by the switched-capacitor circuit 700 in FIG. 7. Therefore, the pipelined ADC 900 also has the advantage of high linearity.

Certain terms are used in the specification and the claims to refer to specific components. However, those of ordinary skill in the art would understand that the same components may be referred to by different terms. The specification and claims do not use the differences in terms as a way to distinguish components, but the differences in functions of the components are used as a basis for distinguishing. Furthermore, it should be understood that the term "comprising" used in the specification and claims is open-ended, that is, including but not limited to. In addition, "coupling" herein includes any direct and indirect connection means. Therefore, if it is described that the first component is coupled to the second component, it means that the first component can be directly connected to the second component through electrical connection or signal connections including wireless transmission, optical transmission, and the like, or the first component is indirectly electrically or signally connected to the second component through other component(s) or connection means.

It will be understood that, in the description herein and throughout the claims that follow, the phrase "and/or" includes any and all combinations of one or more of the associated listed items. Unless the context clearly dictates otherwise, the singular terms used herein include plural referents.

Although the present disclosure has been described in considerable detail with reference to certain embodiments thereof, other embodiments are possible. Therefore, the spirit and scope of the appended claims should not be x to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A switched-capacitor circuit, comprising:
   a first sampling capacitor array, configured to sample a first input voltage in a sampling phase;
   a charge-transfer circuit, comprising a first current source and a second current source with different current-voltage characteristics, wherein the first current source and the second current source are coupled to a first output terminal;
   a control circuit, configured to adjust a sampling result of the first sampling capacitor array in a preset phase according to the first input voltage to generate a first adjusted voltage, and configured to enable one of the first current source and the second current source in a charge-transfer phase according to the first input voltage, so that the charge-transfer circuit amplifies the first adjusted voltage in the charge-transfer phase in order to generate a first output voltage at the first output terminal; and
   a second sampling capacitor array, configured to sample a second input voltage in the sampling phase,
   wherein the charge-transfer circuit further comprises a third current source and a fourth current source with different current-voltage characteristics, wherein the third current source and the fourth current source are coupled to a second output terminal,
   wherein the control circuit is further configured to adjust a sampling result of the second sampling capacitor array in the preset phase according to the second input voltage to generate a second adjusted voltage, and configured to enable the one of the first current source and the second current source and one of the third current source and the fourth current source in the charge-transfer phase according to an input voltage difference between the first input voltage and the second input voltage, so that the charge-transfer circuit amplifies the second adjusted voltage in the charge-transfer phase in order to generate a second output voltage at the second output terminal.

2. The switched-capacitor circuit of claim 1, wherein the control circuit comprises:

an analog-to-digital converter (ADC), configured to compare the input voltage difference with a plurality of voltage thresholds to determine a first voltage range including the input voltage difference from a plurality of voltage ranges, and configured to output a first digital code corresponding to the first voltage range, wherein the plurality of voltage ranges are identified by the plurality of voltage thresholds arranged in ascending order; and a decoder, configured to determine each of the first current source, the second current source, the third current source and the fourth current source is enabled or disabled according to the first digital code.

3. The switched-capacitor circuit of claim 1, wherein when the input voltage difference is in an M-th voltage range of a plurality of voltage ranges, the control circuit enables the first current source and the third current source, wherein M is a positive integer; and when the input voltage difference is in an (M+1)-th voltage range of the plurality of voltage ranges, the control circuit enables the second current source and the fourth current source.

4. The switched-capacitor circuit of claim 3, wherein when the input voltage difference is in the M-th voltage range, the first output voltage is smaller than the second output voltage; and when the input voltage difference is in the (M+1)-th voltage range, the first output voltage is larger than the second output voltage.

5. The switched-capacitor circuit of claim 3, wherein in the preset phase, the first output terminal is reset to a low voltage and the second output terminal is reset to a high voltage, wherein when applying a first voltage difference variation to the first current source operated in a first saturation region and the second current source operated in a second saturation region, an output current variation of the first current source is smaller than an output current variation of the second current source, wherein when applying a second voltage difference variation to the third current source operated in a third saturation region and the fourth current source operated in a fourth saturation region, an output current variation of the third current source is smaller than an output current variation of the fourth current source.

6. The switched-capacitor circuit of claim 1, wherein the control circuit comprises:

an ADC, configured to compare the first input voltage with a plurality of voltage thresholds, so as to determine a first voltage range including the first input voltage from a plurality of voltage ranges, and configured to output a first digital code corresponding to the first voltage range, wherein the plurality of voltage ranges are identified by the plurality of voltage thresholds arranged in ascending order; and a decoder, configured to determine each of the first current source and the second current source is enabled or disabled according to the first digital code.

7. The switched-capacitor circuit of claim 1, wherein when the first input voltage is in an M-th voltage range of a plurality of voltage ranges, the control circuit enables the first current source, wherein M is a positive integer; and when the first input voltage is in an (M+1)-th voltage range of the plurality of voltage ranges, the control circuit enables the second current source.

8. The switched-capacitor circuit of claim 7, wherein when the first input voltage is in the M-th voltage range, the first output voltage is smaller than a common voltage; and when the first input voltage is in the (M+1)-th voltage range, the first output voltage is larger than or equal to the common voltage.

9. The switched-capacitor circuit of claim 7, wherein in the preset phase, the first output terminal is reset to a low voltage and the second output terminal is reset to a high voltage, wherein when applying a first voltage difference variation to the first current source operated in a first saturation region and the second current source operated in a second saturation region, an output current variation of the first current source is smaller than an output current variation of the second current source.

10. A switched-capacitor circuit, comprising:

a first sampling capacitor array, configured to sample a first input voltage in a sampling phase;

a charge-transfer circuit, comprising a first current source and a second current source with different current-voltage characteristics, wherein the first current source and the second current source are coupled to a first output terminal;

a control circuit, configured to couple a first reference voltage to a sample result of the first sampling capacitor array in a preset phase to generate a first adjusted voltage, and configured to determine, according to a relationship between a plurality of voltage thresholds and the first input voltage, magnitude of the first reference voltage and select one of the first current source and the second current source to be enabled in a charge-transfer phase, so that the charge-transfer circuit amplifies the first adjusted voltage in the charge-transfer phase in order to generate a first output voltage at the first output terminal; and a second sampling capacitor array, configured to sample a second input voltage in the sampling phase, wherein the charge-transfer circuit further comprises a third current source and a fourth current source with different current-voltage characteristics, wherein the third current source and the fourth current source are coupled to a second output terminal, wherein the control circuit is further configured to couple a second reference voltage to a sampling result of the second sampling capacitor array in the preset phase to generate a second adjusted voltage, and configured to determine the first reference voltage and a second reference voltage, according to a comparing result between the plurality of voltage thresholds and an input voltage difference between the first input voltage and the second input voltage, wherein the control circuit is further configured to select, according to the comparing result, the one of the first current source and the second current source and one of the third current source and the fourth current source to be enabled in the charge-transfer phase, so that the charge-transfer circuit amplifies the second adjusted voltage in the charge-transfer phase in order to generate a second output voltage at the second output terminal.

11. The switched-capacitor circuit of claim 10, wherein in a case of the plurality of voltage thresholds being in ascending order, when the input voltage difference is adjacent to a J-th voltage threshold of the plurality of voltage thresholds, and is smaller than the J-th voltage threshold, the control circuit enables the first current source and the third current source, wherein J is an odd number, in the case of the plurality of voltage thresholds being in the ascending order, when the input voltage difference is adjacent to the J-th voltage threshold, and is larger than or equal to the J-th voltage threshold, the control circuit enables the second current source and the fourth current source.

12. The switched-capacitor circuit of claim 11, wherein when the input voltage difference is adjacent to the J-th voltage threshold and is smaller than the J-th voltage threshold, the first output voltage is smaller than the second output voltage, when the input voltage difference is adjacent to the J-th voltage threshold and is larger than or equal to the J-th voltage threshold, the first output voltage is larger than the second output voltage.

13. The switched-capacitor circuit of claim 11, wherein in the preset phase, the first output terminal is reset to a low voltage and the second output terminal is reset to a high voltage, wherein when applying a first voltage difference variation to the first current source operated in a first saturation region and the second current source operated in a second saturation region, an output current variation of the first current source is smaller than an output current variation of the second current source, wherein when applying a second voltage difference variation to the third current source operated in a third saturation region and the fourth current source operated in a fourth saturation region, an output current variation of the third current source is smaller than an output current variation of the fourth current source.

14. The switched-capacitor circuit of claim 10, wherein the control circuit is configured to compare the first input voltage with a plurality of voltage thresholds, in a case of the plurality of voltage thresholds being in ascending order, when the first input voltage is adjacent to a J-th voltage threshold of the plurality of voltage thresholds, and is smaller than the J-th voltage threshold, the control circuit enables the first current source, wherein J is an odd number, in the case of the plurality of voltage thresholds being in the ascending order, when the first input voltage is adjacent to the J-th voltage threshold, and is larger than or equal to the J-th voltage threshold, the control circuit enables the second current source.

15. The switched-capacitor circuit of claim 14, wherein when the first input voltage is adjacent to the J-th voltage threshold, and is smaller than the J-th voltage threshold, the first output voltage is smaller than a common voltage;

when the first input voltage is adjacent to the J-th voltage threshold, and is larger than or equal to the J-th voltage threshold, the first output voltage is larger than or equal to the common voltage.

16. The switched-capacitor circuit of claim 14, wherein in the preset phase, the first output terminal is reset to a low voltage and the second output terminal is reset to a high voltage, wherein when applying a first voltage difference variation to the first current source operated in a first saturation region and the second current source operated in a second saturation region, an output current variation of the first current source is smaller than an output current variation of the second current source.

17. A pipelined ADC, comprising a plurality of converter circuit systems, wherein each converter circuit system comprises:

a first sampling capacitor array, configured to sample a first input voltage in a sampling phase;

a charge-transfer circuit, comprising a first current source and a second current source with different current-voltage characteristics, wherein the first current source and the second current source are coupled to a first output terminal;

a control circuit, configured to adjust a sampling result of the first sampling capacitor array in a preset phase according to the first input voltage to generate a first adjusted voltage, and configured to enable one of the first current source and the second current source in a charge-transfer phase according to the first input voltage, so that the charge-transfer circuit amplifies the first adjusted voltage in the charge-transfer phase in order to generate a first output voltage at the first output terminal; and a second sampling capacitor array, configured to sample a second input voltage in the sampling phase, wherein the charge-transfer circuit further comprises a third current source and a fourth current source with different current-voltage characteristics, wherein the third current source and the fourth current source coupled are coupled to a second output terminal, wherein the control circuit is further configured to adjust a sampling result of the second sampling capacitor array in the preset phase according to the second input voltage to generate a second adjusted voltage, and configured to enable the one of the first current source and the second current source and one of the third current source and the fourth current source in the charge-transfer phase according to an input voltage difference between the first input voltage and the second input voltage, so that the charge-transfer circuit amplifies the second adjusted voltage in the charge-transfer phase, in order to generate a second output voltage at the second output terminal.

\* \* \* \* \*